ELECTRICAL DEVICE WITH VOLTAGE LIMITING ARRANGEMENT

Filed Jan. 15, 1965

Inventor,
William D. Bacon, Jr.,
by Sidney Greenberg
His Attorney.

United States Patent Office 3,334,271

Patented Aug. 1, 1967

3,334,271

ELECTRICAL DEVICE WITH VOLTAGE LIMITING ARRANGEMENT

William D. Bacon, Jr., East Flat Rock, N.C., assignor to General Electric Company, a corporation of New York Filed Jan. 15, 1965, Ser. No. 425,794
10 Claims. (Cl. 317—16)

The present invention relates to electrical devices with a voltage limiting arrangement, and more particularly relates to such devices as electrical relays equipped with a built-in protective spark gap device.

The use of impulse gaps in circuits which include electro-magnetic relay devices are already known, the gaps being provided to protect various components of the circuit against the effects of transient high voltage surges. In the case of photoelectric control circuits, employed for example to control the operation of outdor lighting apparatus, it has been the practice to mount the control circuit components on a printed circuit board and to provide apertures in the board in suitable places in the circuit to serve as impulse gap means. However, such arrangements were subject to certain disadvantages. It was difficult to provide gaps in the circuit board which had accurately defined spacings. Furthermore, gaps formed in the circuit board required masking during the soldering process applied to the board to interconnect the electrical components. Such gaps nevertheless were subject to the risk of contamination from the flux and solder baths used in the soldering operation. As a result the spark gaps thus produced not only necessitated the use of complicated and difficult processing steps in manufacture, but also did not result in uniform and reliable overvoltage protection in the operating circuits.

It is an object of the invention to provide an improved voltage limiting arrangement, and especially a protective air gap for electric devices, which avoids the above mentioned disadvantages.

It is another object of the invention to provide an electrical device, and especially an electrical relay, having a built-in voltage limiting or protective air gap device for the protection of components in circuit with the electrical device.

It is still another object of the invention to provide air gap arrangements of the above type which are simple in construction and readily and economically manufactured, which produce uniform and reliable results in operation, and lend themselves to accurate and precise control of voltage.

It is a particular object of the invention to provide an electrical relay device having a built-in protective gap arrangement which is especially adapted for use in photoelectric controls, which provides for protection of other electrical components in the photoelectric control circuit, and which dispenses with the need for separate spark gap arrangements of the type heretofore employed in such circuits.

Other objects and advantages will become apparent from the following description and the appended claims.

With the above objects in view, the present invention relates, in a broad aspect, to a voltage limiting arrangement which comprises an electrical device having an insulating mounting member, first and second conducting members adapted to have a normal potential difference therebetween during operation of the electrical device, at least one of the conducting members being fixedly secured to the insulating mounting member, and an auxiliary conducting member electrically connected to the other of the conducting members and secured to the insulating mounting member with a portion of the auxiliary mounting member in fixed spatial relation to the one conducting member to provide therebetween an air gap across which a spark is produced upon the occurrence of a potential difference between the first and second conducting members which exceeds the normal potential difference by a predetermined amount.

In a particular embodiment of the present invention, the auxiliary conducting member is secured to the frame of an electromagnetic relay device and is mounted on the insulating mounting member so as to be spaced a fixed distance from a conducting strip of the electrical relay which is adapted to be inserted in a printed circuit board in a photoelectric control circuit, so that occurrence of an excess voltage in the photoelectric control circuit will cause a sparkover at the gap between the auxiliary conducting member and the conducting strip, thereby protecting the electrical components in the sensing circuit of the photoelectric control circuit.

The invention will be better understood from the following description taken in conjunction with the accompanying drawing, in which.

Figures 1, 2:
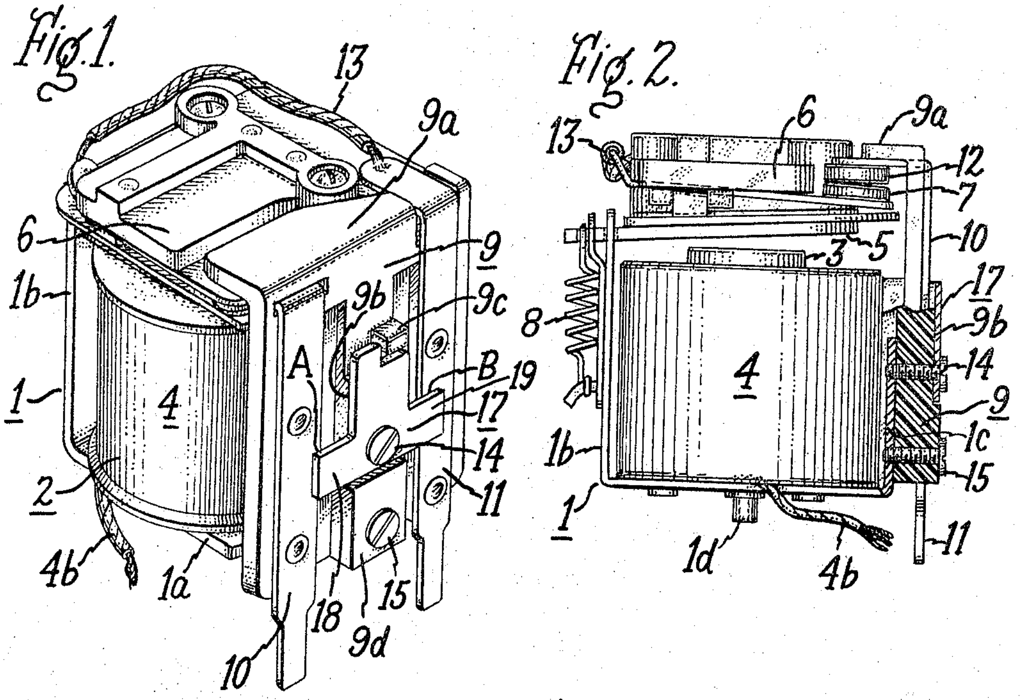
FIGURE 1 is a perspective view of an electromagnetic relay embodying the invention.
FIGURE 2 is a side elevation of the FIGURE 1 relay, with a portion thereof shown in section.
Figure 3:
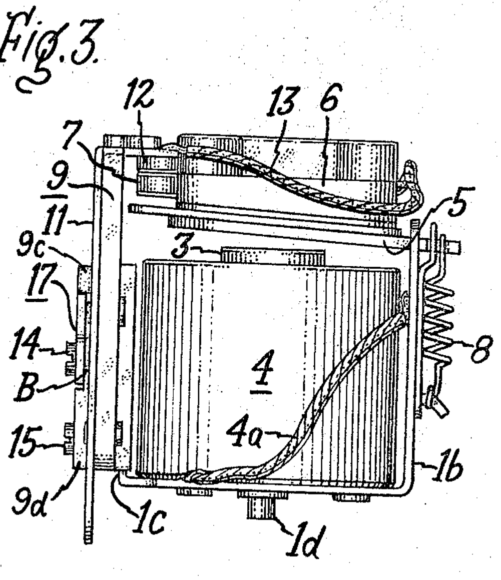
FIGURE 3 is an elevational view of the opposite side of the relay shown in FIGURE 2.

Referring now to the drawing, and particularly to FIGURES 1, 2 and 3, there is shown an electromagnetic relay device comprising a metal frame member 1 of generally U-shape having a base portion 1*a* and opposite legs 1*b*, 1*c* projecting upwardly therefrom. Mounting lug 1*d* is integral with base portion 1*a*. Electromagnet 2 comprising core 3 and energizing coil 4 is mounted on the base portion 1*a* of frame 1. Armature 5 is pivotally mounted at one end to the top portion of leg 1*b* of the frame and has secured thereon for movement therewith a contact arm carrier 6 of insulating material holding contact 7 insulated from armature 5. The outer end of armature 5 is held by spring 8 so as to bias contact 7 upwardly. Insulating panel 9 is secured at its inner side intermediate its width to leg 1*c* of frame 1 (see FIGURE 2) by means of mounting screws 14 and 15 which are threaded into apertures in leg 1*c*. As seen in FIGURE 1, flat metal legs or lead strips 10 and 11 are fixedly secured such as by rivets or the like to the outer face of mounting panel 9 in spaced parallel relation adjacent the opposite lateral edges of the panel, and with their outer surfaces lying substantially in the same plane. The lower ends of conducting legs 10 and 11 project below frame 1 and are suitably formed to be adapted for insertion into apertures in a printed circuit board. As seen in FIGURE 2, the upper end of leg 10 is bent inwardly and passes through an opening in panel 9 and extends along the underside of horizontal portion 9*a* of the panel, terminating in a contact 12 against which contact 7 is biased by spring 8. As seen in FIGURES 1 and 3, the upper end of leg 11 is bent over the top of panel 9 and is connected thereby means of wire 13 to contact 7. One end 4*a* of coil 4 is electrically connected to frame 1 (see FIGURE 3), while the other end 4*b* (see FIGURE 2) is available for connection to the control circuit as disclosed hereinafter.

As shown, the outer face of insulating mounting panel 9, which is made of suitable electrically insulating material such as a phenolic resin, is formed with a raised surface portion 9*b* located between conducting legs 10, 11 and opposite frame leg 1*c* (see FIGURE 2). In accordance with the invention, an auxiliary metal plate member 17 is detachably fastened to raised surface 9*b* by mounting screw 14 which engages a threaded aperture in frame leg 1c so that plate member 17 is electrically connected to frame 1. Conductive plate member 17 is formed with laterally extending arm portions 18 and 19 which substantially overlap the respective conductive legs 10 and 11, but which are spaced therefrom a predetermined distance corresponding substantially to the distance which surface portion 9b projects beyond the flat outer surfaces of conducting legs 10 and 11. Panel 9 is further formed with raised portions 9c and 9d respectively located above and below raised portion 9b for properly positioning plate member 17 on panel 9, and plate member 17 has a notch formed in the upper corner thereof for fitting against positioning portion 9c. As will be understood, other arrangements than those shown could be used to properly position metal plate member 17 on panel 9.

The spacing thus provided between the laterally extending arms 18 and 19 of plate member 17 and the respective surfaces of conducting legs 10 and 11 form air gaps A and B which serve to protect the electrical components in the circuit in which the relay is connected from voltage surges. When the voltage between plate member 17 and either leg 10, 11 is sufficient to overcome the dielectric strength of the air gap thus provided, a spark will be formed across the gap, thereby limiting the voltaeg differential between member 17 and either conducting leg 10 or 11. The components of the gap as thus described may be accurately made and assembled to provide for sparkover across the gap when the potential across it exceeds a predetermined voltage.

Figure 4:
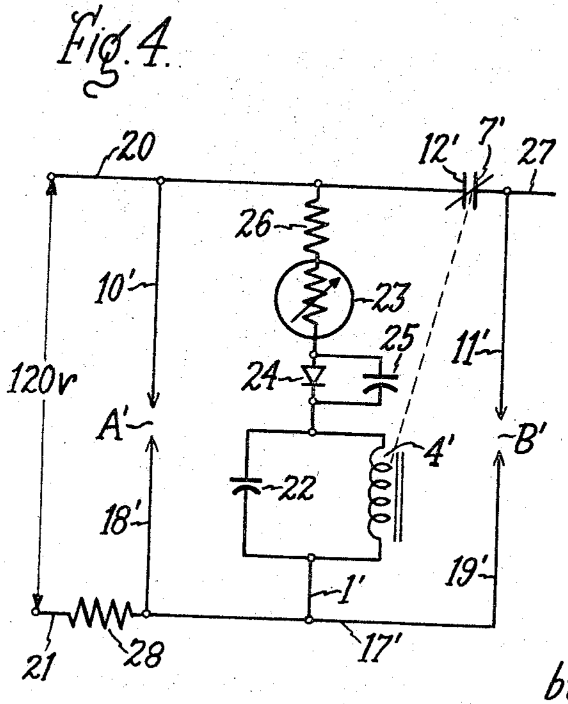
FIGURE 4 is a circuit diagram showing the application of the electrical relay shown in FIGURES 1–3 to a photoelectric control circuit.

FIGURE 4 shows diagrammatically a typical photoelectric control circuit in which the relay device thus described may be incorporated, and which is suitable for use with outdoor lighting apparatus. In the circuit diagram shown, apply lines 20 and 21 are adapted to be connected to a source of alternating current, with line 21 being the neutral line and having a current limiting resistor 28 in series therewith. Line 20 has an alternating voltage potential of about 120 volts at a frequency of 60 cycles per second. Relay coil 4′ with energy storage capacitor 22 in shunt therewith is connected across the supply lines in series with a photoelectric cell 23, with rectifier 24 which has RF bypass capacitor 25 in shunt therewith, and with resistor 26 which limits the daytime current through the sensing circuit.

In the diagram, conductors 10′ and 11′ represent portions of conducting legs 10 and 11 of the relay described previously, these conductors being respectively connected to normally closed contacts 12′ and 7′. Conductor 11′ is also connected to a lead 27 to which the load, e.g., a lamp, is connected. Conductor 1′ represents frame 1 of the relay to which is electrically connected conducting member 17′ corresponding to auxiliary plate member 17, while conductors 18′, 19′ correspond to arm portions 18, 19 of the plate member and form gaps A′ and B′ with the adjacent portions of conductors 10′ and 11′.

Resistor 28 serves to limit any follow-through current from the power line while the air in the gaps is still ionized as a result of sparkover.

The described control circuit operates such that during daytime with light falling on photocell 23 the resistance in the photocell is very low and current is allowed to flow in the sensing circuit through relay coil 4 which attracts the relay armature 5 and opens normally closed contacts 7 and 12. As a result, current no longer passes to the load lead 27 and the lighting load connected thereto is deenergized. When darkness falls, the incident light on photocell 23 is reduced and the resistance of the photocell increases to a point where relay coil 4 is de-energized, resulting in closing of contacts 7 and 12 and thereby reconnecting the lighting load to the current supply line.

When a high voltage surge occurs between supply line 20 and neutral line 21, air gap A′ breaks down, bypassing the voltage surge around the components in the photocell sensing circuit. Air gap B′ which extends between the load line 27 and neutral line 21 provides added protection in bypassing voltage surges occurring between load line 27 and neutral line 21.

In a typical construction the gap spacing between the arms of plate member 17 and conducting legs 10 and 11 is nominally .010 inch and provides for a sparkover between 1400 volts minimum and 2000 volts maximum for a ½ microsecond rise to peak voltage, as is typically encountered in voltage transients occurring in the described apparatus.

By virtue of the described arrangement the difficulties heretofore attendant on the provision of spark gaps in the printed circuit board in which the electrical components are conventionally mounted are fully overcome. The required gap spacing is easily and precisely provided simply by molding the insulating panel member 9, and particularly the surface portion 9b thereof, to the necessary dimension, so that merely attaching plate member 17 in place on panel 9 as described automatically ensures the provision of two protective gaps with accurately controlled spacing. The actual sparkover takes place between the adjacent edges of plate member 17 and legs 10 and 11, and the relatively sharp edges which characterize these elements, coupled with their rigidly fixed positions, afford the advantage of uniform sparkover characteristics even over prolonged periods of use, and in this respect the gaps provide improved performance as compared to gap electrodes of rounded configuration and other constructions.

It will be understood that, if desired, plate member 17 may be so shaped as to have only one arm portion extending over conducting leg 10 or 11 and thus provide only one air gap, either on the load side or the line side, rather than providing two air gaps as shown.

It will also be evident that although the relay with combined gap device has been disclosed in connection specifically with its use in a photoelectric control circuit, the described arrangement may be used for the principles thereof applied for low-cost, reliable over-voltage protection of any apparatus or circuit employing a relay or similar load-switching device. It may also find use in various other types of devices and circuits for voltage limiting purposes, whether for protective functions or other reasons. For example, the spark produced across the air gap may be utilized to actuate other components for various purposes.

Accordingly, while the present invention has been described with reference to particular embodiments thereof, it will be understood that numerous modifications may be made by those skilled in the art without actually departing from the scope of the invention. Therefore, the appended claims are intended to cover all such equivalent variations as come within the true spirit and scope of the invention.

What I claim as new and desire to secure by Letters Patent of the United States is:

1. A voltage limiting arrangement comprising, in combination, an electrical device having an insulating mounting member and first and second conducting members adapted to have a normal potential difference therebetween during operation of said electrical device, at least one of said conducting members being fixedly secured to said insulating mounting member, and an auxiliary conducting member electrically connected to the other of said conducting members and secured to said insulating mounting member with a portion of said auxiliary conducting member in fixed spatial relation to said one conducting member and overlying the same in close proximity to provide therebetween an air gap of predetermined spacing across which a spark is produced upon the occurrence of a potential difference between said first and second conducting members which exceeds said normal potential difference by a predetermined amount.

2. A voltage limiting arrangement comprising, in combination, an electrical device having an insulating mounting member and first and second conducting members adapted to have a normal potential difference therebetween during operation of said electrical device, at least one of said conducting members being fixedly secured to said insulating mounting member, and an auxiliary conducting plate member fastened to said insulating mounting member in electrical connection to the other of said conducting members with a portion of said plate member overlying a portion of said one conducting member in fixed spatial relation thereto to provide therebetween an air gap of predetermined spacing across which a spark is produced upon the occurrence of a potential difference between said first and second conducting members which exceeds said normal potential difference by a predetermined amount.

3. A voltage limiting arrangement comprising, in combination, an electrical device having a conducting support member and an insulating mounting member secured thereto, a pair of spaced relatively rigid conducting lead members fixedly secured to said insulating mounting member and insulated thereby from said conducting support member, said conducting lead members being adapted to be connected respectively to the line side and the load side of an electrical circuit, said conducting support member and said pair of conducting lead members being adapted to have a normal potential difference therebetween during operation of said circuit, and an auxiliary conducting plate member fastened to said insulating mounting member in electrical connection to said conducting support member and having portions overlying portions of both said conducting lead members in fixed spatial relation thereto to provide therebetween air gaps of predetermined spacing across which a spark is produced upon the occurrence of a potential difference between either of said conducting lead members and said conducting support member which exceeds said normal potential difference by a predetermined amount.

4. A voltage limiting arrangement comprising, in combination, an electrical device having a conducting support member, an insulating panel member having opposite sides and secured at one side to said conducting support member, a conducting lead member fixedly secured to the opposite side of said insulating panel member, said conducting support member and said conducting lead member being adapted to have a normal potential difference therebetween during operation of said electrical device, and an auxiliary conducting plate member fastened to said opposite side of said insulating panel member in electrical connection with said conducting support member and adjacent said conducting lead member, and having a portion overlying a portion of said conducting lead member in fixed spatial relation thereto to provide therebtween an air gap of predetermined spacing across which a spark is produced upon the occurrence of a potential difference between said conducting support member and said conducting lead member which exceeds said normal potential difference by a predetermined amount.

5. A voltage limiting arrangement comprising, in combination, an electrical device having a conducting support member, an insulating panel member having opposite sides and secured at one side to said conducting support member, a pair of spaced relatively rigid conducting lead members fixedly secured to the opposite side of said insulating panel member and being insulated thereby from said conducting support member, said conducting support member and said pair of conducting lead members being adapted to have a normal potential difference therebetween during operation of said electrical device, said insulating panel member having a raised portion on said opposite side thereof between and projecting a predetermined distance beyond said pair of conducting lead members, and an auxiliary conducting plate member fastened to said raised portion of said insulating panel member in electrical connection with said conducting support member and having a portion overlying a portion of at least one of said conducting lead members in fixed spatial relation thereto to provide therebetween an air gap of predetermined spacing across which a spark is produced upon the occurrence of a potential difference between said pair of conducting lead members and said conducting support member which exceeds said normal potential difference by a predetermined amount.

6. A protective voltage limiting arrangement comprising, in combination, an electrically conducting frame member, an electromagnet mounted on said frame member and having relay contact means operable thereby, an insulating panel member mounted on said frame member, a conducting lead member fixedly mounted on said insulating panel member insulated from said conducting frame member and electrically connected to said relay contact means, and an auxiliary conducting member mounted on said insulating panel member in electrical connection with said frame member and having a portion spaced a predetermined distance from the conducting lead member to provide a protective air gap therebetween.

7. A protective voltage limiting arrangement comprising, in combination, an electrical relay device comprising an electrically conducting frame member, an electromagnet mounted on said frame member, first contact means mounted on said frame member operable by said electromagnet, an insulating panel member mounted on said frame member, second contact means on said insulating panel member adapted to coact with said first contact means, a pair of spaced conducting lead members fixedly mounted on said panel member insulated from said frame member, said conducting lead members being connected to different ones of said first and second contact means, said conducting frame member and said pair of conducting lead members being adapted to have a normal potential difference therebetween during operation of said electrical relay device, and an auxiliary conducting member electrically connected to said conducting frame member and secured to said insulating panel member with portions thereof overlying said conducting lead members in fixed spatial relation thereto to provide therebetween air gaps of predetermined spacing across which a spark is produced on the occurrence of a potential difference between said conducting frame member and said pair of conducting lead members which exceed said normal potential difference by a predetermined amount.

8. A protective voltage limiting arrangement comprising, in combination, an electrical relay device comprising an electrically conducting frame member, an electromagnet mounted on said frame member, first electrical contact means movably mounted on said frame member operable by said electromagnet, an insulating panel member having opposite sides and mounted at one side on said frame member, second electrical contact means on said insulating panel member adapted to co-act with said first contact means, a pair of spaced conducting lead members fixedly mounted on the opposite side of said insulating panel member and insulated from said frame member, said conducting lead members being respectively connected to said first and second contact means, said conducting frame member and said pair of conducting lead members being adapted to have a normal potential difference therebetween during operation of said electrical relay device, and an auxiliary conducting plate member mounted on said opposite side of said insulating panel member in electrical connection with said frame member and having a portion overlying at least one of said conducting lead members in fixed spatial relation thereto to provide therebetween an air gap of predetermined spacing across which a spark is produced upon the occurrence of a potential difference between said conducting frame member and said pair of conducting lead members which exceeds said normal potential difference by a predetermined amount.

9. A protective voltage limiting arrangement comprising, in combination, an electrical relay device comprising an electrically conducting frame member, an electromagnet mounted on said frame member, an armature mounted on said frame member for movement relative to said electromagnet and having first contact means movable therewith, an insulating panel member having opposite sides and mounted at one side on said frame member, second electrical contact means on said panel member adapted to co-act with said first contact means, a pair of spaced conducting flat strips fixedly mounted on the opposite side of said insulating panel member insulated from said frame member, said flat strips having outer surfaces lying substantially in a plane, said conducting flat strips being respectively connected to said first and second contact means, said conducting frame member and said pair of conducting flat strips being adapted to have a normal potential difference therebetween during operation of said relay device, said insulating panel member having on said opposite side a raised portion between said flat strips having a surface extending a predetermined distance beyond said plane, and an auxiliary conducting plate member resting against said raised panel surface and secured in assembly with said insulating panel member and said conducting frame member in electrical connection with the latter member, said auxiliary plate member having arm portions overlying at least one of said flat strips spaced therefrom substantially at said predetermined distance to provide therebetween air gaps of predetermined spacing across which a spark is produced upon the occurrence of a potential difference between said frame member and said pair of flat strips which exceeds said normal potential difference by a predetermined amount.

10. A protective voltage limiting arrangement comprising, in combination, an electrical relay device comprising an electrically conductive U-shaped frame member, an electromagnet mounted on said frame member, an armature mounted on one leg of said frame member for movement relative to said electromagnet and having first contact means movable therewith, an insulating panel member having opposite sides and mounted at one side on the other leg of said frame member, second electrical contact means on said panel member adapted to co-act with said first contact means, a pair of spaced conducting flat strips fixedly mounted on the opposite side of said insulating panel member insulated from said frame member, said flat strips having outer surfaces lying substantially in a plane, said conducting flat strips being respectively connected to said first and second contact means, said conducting frame member and said pair of conducting flat strips being adapted to have a normal potential difference therebetween during operation of said relay device, said insulating panel member having on said opposite side a raised portion between said flat strips having a surface extending a predetermined distance beyond said plane, and an auxiliary conducting plate member resting against said raised panel surface and secured in assembly with said insulating panel member and said conducting frame member in electrical connection with the latter member, said auxiliary plate member having arm portions overlying at least one of said flat strips spaced therefrom substantially at said predetermined distance to provide therebetween air gaps of predetermined spacing across which a spark is produced upon the occurrence of a potential difference between said frame member and said pair of flat strips which exceeds said normal potential difference by a predetermined amount, said insulating panel member being further formed with raised surface portions for positioning said auxiliary plate member in predetermined position relative to said flat conducting strips.

References Cited

UNITED STATES PATENTS 2,666,908 1/1954 Klostermann ------- 317—69 X

MILTON O. HIRSHFIELD, *Primary Examiner.*

J. D. TRAMMELL, *Assistant Examiner.*